United States Patent
Daigle et al.

(10) Patent No.: US 11,082,019 B2
(45) Date of Patent: Aug. 3, 2021

(54) AMPLIFIER WITH ADAPTIVELY-CONTROLLED LOCAL FEEDBACK LOOP

(71) Applicant: SEMICONDUCTOR COMPONENTS INDUSTRIES, LLC, Phoenix, AZ (US)

(72) Inventors: Tyler Daigle, Scarborough, ME (US); Hrvoje Jasa, Scarborough, ME (US); Andrew Jordan, Scarborough, ME (US); Gregory Maher, Cape Elizabeth, ME (US)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 0 days.

(21) Appl. No.: 16/843,675

(22) Filed: Apr. 8, 2020

(65) Prior Publication Data

US 2021/0211109 A1     Jul. 8, 2021

Related U.S. Application Data

(60) Provisional application No. 62/958,142, filed on Jan. 7, 2020.

(51) Int. Cl.
*H03F 3/45* (2006.01)
*H03F 3/217* (2006.01)
*H03F 1/34* (2006.01)

(52) U.S. Cl.
CPC ......... *H03F 3/45475* (2013.01); *H03F 1/345* (2013.01); *H03F 3/2175* (2013.01); *H03F 3/45941* (2013.01); *H03F 2200/156* (2013.01); *H03F 2200/471* (2013.01); *H03F 2203/45151* (2013.01); *H03F 2203/45442* (2013.01)

(58) Field of Classification Search
CPC ....................................................... H03F 3/45
See application file for complete search history.

(56) References Cited

U.S. PATENT DOCUMENTS

| | | | |
|---|---|---|---|
| 5,206,602 A | 4/1993 | Baumgartner et al. | |
| 5,914,638 A | 6/1999 | He | |
| 6,583,652 B1* | 6/2003 | Klein | H03F 3/45197 327/103 |
| 8,310,308 B1* | 11/2012 | Ginsburg | H03F 3/45645 330/258 |

(Continued)

*Primary Examiner* — Patricia T Nguyen
(74) *Attorney, Agent, or Firm* — Brake Hughes Bellermann LLP

(57) ABSTRACT

In a general aspect, a circuit can include an input circuit configured to receive an input signal, and an amplifier circuit coupled with the input circuit. The amplifier circuit can include an amplifier, and first and second feedback paths. The first feedback path can be from a positive output to a negative input of the amplifier, and the second feedback path can be from a negative output to a positive input of the first amplifier. The circuit can also include a loop circuit configured to provide a local feedback loop for the first amplifier and configured to control current flow into the positive input of the first amplifier and current flow into the negative input of the first amplifier. The circuit can also include a control circuit that is configured to enable the loop circuit in response to a magnitude of the input signal exceeding a threshold.

20 Claims, 8 Drawing Sheets

(56) References Cited

U.S. PATENT DOCUMENTS

| | | | |
|---|---|---|---|
| 8,330,537 B1* | 12/2012 | Ghorpade | H03F 3/38 |
| | | | 330/9 |
| 8,604,861 B1 | 12/2013 | Ceballos et al. | |
| 9,966,907 B1* | 5/2018 | Bafar | H03F 3/45475 |
| 10,312,802 B2* | 6/2019 | Lesso | H03G 3/30 |
| 10,396,724 B1 | 8/2019 | Daigle et al. | |
| 2003/0151430 A1* | 8/2003 | Hakkarainen | H03M 1/165 |
| | | | 327/94 |
| 2009/0115522 A1 | 5/2009 | Lyden et al. | |
| 2009/0179699 A1 | 7/2009 | Higuchi | |
| 2013/0169361 A1 | 7/2013 | Killat | |
| 2013/0223652 A1 | 8/2013 | Sahandiesfanjani et al. | |
| 2014/0176238 A1 | 6/2014 | Guo et al. | |
| 2016/0173037 A1* | 6/2016 | Puscasu | H03F 3/45273 |
| | | | 330/260 |
| 2017/0019078 A1 | 1/2017 | Galal | |
| 2017/0077882 A1 | 3/2017 | Wang et al. | |
| 2018/0055409 A1 | 3/2018 | Xu | |
| 2020/0395905 A1* | 12/2020 | Schober | H03K 19/00384 |

* cited by examiner

AMPLIFIER WITH ADAPTIVELY-CONTROLLED LOCAL FEEDBACK LOOP

CROSS-REFERENCE TO RELATED APPLICATION

This application claims the benefit of U.S. Provisional Application No. 62/958,142, filed on Jan. 7, 2020, which is hereby incorporated by reference in its entirety.

TECHNICAL FIELD

This description generally relates to amplifiers, such as differential amplifier circuits and systems.

BACKGROUND

In general, an amplifier (e.g., a differential amplifier) can be a DC-coupled high-gain electronic voltage amplifier that accepts a differential input voltage and produces a differential output voltage. The output of the differential amplifier can be controlled by two feedback paths, one feedback path on the positive voltage input and another feedback path on the negative input voltage path. In most cases, due to the high gain of the amplifier, each feedback path can play a significant part in determining the output differential voltage for any given input differential voltage. Resistor mismatches in the feedback paths, as well as signal noise can adversely affect the performance of such amplifiers.

SUMMARY

In a general aspect, a circuit can include an input circuit configured to receive an input signal, and an amplifier circuit coupled with the input circuit. The amplifier circuit can include a first amplifier, a first feedback path, and a second feedback path. The first feedback path can provide a feedback path from a positive output of the first amplifier to a negative input of the first amplifier. The second feedback path can provide a feedback path from a negative output of the first amplifier to a positive input of the first amplifier. The circuit can further include a loop circuit including a second amplifier. The loop circuit can be configured to provide a local feedback loop for the first amplifier, and also configured to control current flow into the positive input of the first amplifier and current flow into the negative input of the first amplifier. The circuit can still further include a control circuit coupled with the input circuit and the loop circuit. The control circuit can be configured to enable the loop circuit in response to a magnitude of the input signal exceeding a threshold.

In another general aspect, a system can include a differential amplifier circuit including a first differential amplifier, a first feedback path, and a second feedback path. The first feedback path can provide a feedback path from a positive output of the first differential amplifier to a negative input of the first differential amplifier. The second feedback path can provide a feedback path from a negative output of the first differential amplifier to a positive input of the first differential amplifier. The system can also include a common mode loop circuit including a second differential amplifier. The common mode loop circuit can be configured to provide a local feedback loop for the first differential amplifier, and configured to control current flow into the positive input of the first differential amplifier and current flow into the negative input of the first differential amplifier. The system can still further include a control circuit coupled with the common mode loop circuit. The control circuit can be configured to enable the common mode loop circuit in response to a magnitude of a differential input signal of the differential amplifier exceeding a threshold.

In another general aspect, a circuit can include an input circuit configured to receive a differential input signal, and a differential amplifier circuit coupled with the input circuit. The differential amplifier circuit can include a first differential amplifier, a first feedback path, and a second feedback path. The first feedback path can provide a feedback path from a positive output of the first differential amplifier to a negative input of the first differential amplifier. The second feedback path can provide a feedback path from a negative output of the first differential amplifier to a positive input of the first differential amplifier. The circuit can also include a chopper clock circuit configured to output a chopper clock signal at a variable duty cycle, and a common mode loop circuit. The common mode loop circuit can include a second differential amplifier and chopper switches. The common mode loop circuit can be configured to provide a local feedback loop for the first differential amplifier. The chopper switches can be configured to receive the chopper clock signal from the chopper clock circuit. The common mode loop circuit can be further configured to, via the chopper switches, control a current flow into the positive input of the first amplifier and into the negative input of the first amplifier. The circuit can still further include a control circuit coupled with the common mode loop circuit. The control circuit can be configured to enable the common mode loop circuit in response to a magnitude of the differential input signal exceeding a threshold.

The details of one or more implementations are set forth in the accompanying drawings and the description below. Other features will be apparent from the description and drawings, and from the claims.

BRIEF DESCRIPTION OF THE DRAWINGS

In the drawings, which are not necessarily drawn to scale, like reference symbols may indicate like and/or similar components (elements, structures, etc.) in different views.

Figure 1:
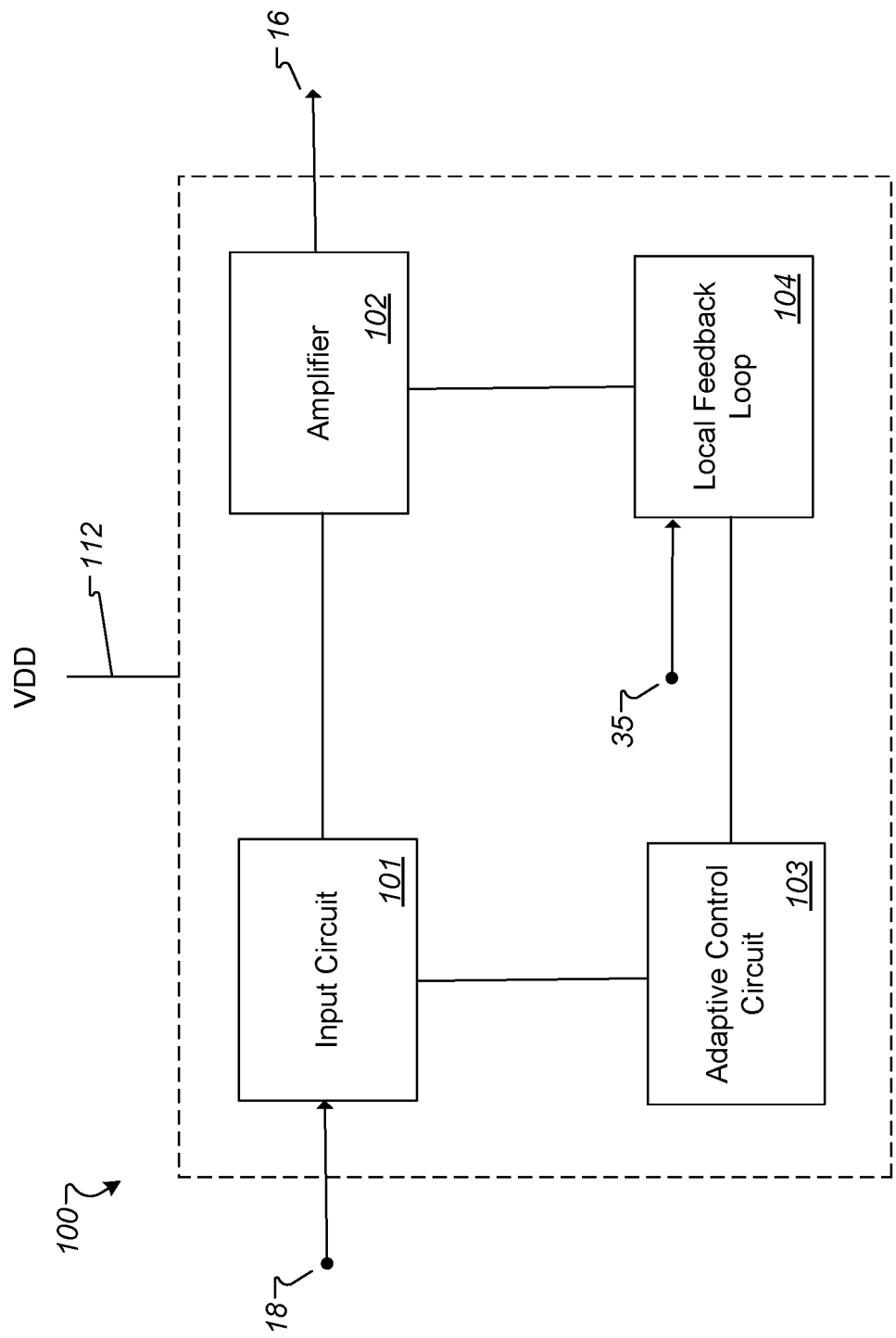
FIG. 1 is a block diagram of a circuit (e.g., amplifier circuit) with an adaptively controlled local feedback loop.

The drawings illustrate generally, by way of example, but not by way of limitation, various implementations discussed in the present disclosure. Reference symbols shown in one drawing may not be repeated for the same, and/or similar elements in related views. Reference symbols that are repeated in multiple drawings may not be specifically discussed with respect to each of those drawings, but are provided for context between related views. Also, not all like elements in the drawings are specifically referenced with a reference symbol when multiple instances of an element are illustrated. In some drawings, elements from related views may be omitted for purposes of clarity. In some drawings, some element may be shown by way of context and may not be specifically referenced and/or discussed in the following detailed description.

DETAILED DESCRIPTION

In an amplifier circuit, such as a differential amplifier circuit, that includes circuitry for performing front end signal filtering and/or that includes, or is implemented with circuitry for performing digital signal processing, there can be a voltage shift (e.g., common mode voltage shift) from an input (common mode) voltage to an output (common mode) voltage. In some implementations, such a differential amplifier circuit can include a Class D amplifier, an audio amplifier, etc. A local (e.g., common mode) loop circuit (local feedback circuit) can be implemented with (coupled with, connected to, etc.) a differential input of the amplifier (e.g., a positive input and a negative input). The local loop circuit can provide a local feedback loop that drives a voltage (e.g., common mode voltage) shift across input resistors to the amplifier to a fixed value. In some implementations, this can reduce the power supply rejection ratio (PSRR) dependence on resistor value mismatch (e.g., input resistors and/or feedback resistors) without impacting the performance of the amplifier (e.g., without significantly increasing harmonic distortion, and/or adversely affecting a PSRR of the amplifier), thus resulting in improved overall performance for an associated amplifier (e.g., a differential amplifier, a Class D amplifier, an audio amplifier, etc.).

However, such local (e.g., common mode) loop circuits can cause an increase in a noise floor (e.g., increase an amount of signal noise) that is present at the amplifier's (e.g., differential) inputs. This increased noise floor can adversely impact small-signal efficiency for an associated amplifier (e.g., operation at low input and output voltages). The input voltage range that is affected by such an increased noise floor (e.g., a voltage range considered to be small-signal, or considered a small-signal processing range) will depend on the particular implementation, such as on operating voltage, operating frequency, amplifier gain, etc.

The implementations of amplifier circuits and systems described herein include (implement) adaptive control of a local (common mode) loop circuit, where a control circuit is included in the amplifier circuit (or system) to enable/disable the local loop circuit based on a magnitude of a signal (e.g., a differential input signal) being processed by the (amplifier) circuit. For instance, such a control circuit can be configured to enable the local loop circuit when a magnitude of a differential input signal being applied to the circuit exceeds a threshold (e.g., the signal magnitude increases above a level considered to be small-signal processing for the given implementation, and is performing, what can be referred to as, large-signal (above the threshold) processing.

Further, such a control circuit (e.g., adaptive control circuit) can be further configured to disable the local loop circuit when the magnitude of the differential input signal is below, or decreases below the threshold, and/or remains below the threshold for a given period of time (e.g., a threshold period of time). Such a delay in disabling the local loop circuit can prevent continual disabling an enabling of the local loop circuit when processing certain signals, such as sine wave signals. For instance, this delay can be established such that the local loop circuit will not be disabled for periodic signals (e.g., sine waves) that have a peak magnitude greater than the threshold voltage and period that is less than or equal to the delay time of an adaptive control circuit, such as is discussed in further detail below.

In some implementations, an output common mode voltage included in an output differential signal of an amplifier can be based on an amplitude (voltage, magnitude, etc.) of that output differential signal. For instance, in some implementations an output common mode voltage can be modulated to a value that is an absolute value of a magnitude of the differential output voltage divided by two. Such approaches can prevent dependence of the output differential signal (voltage) on a power supply voltage of the amplifier and, accordingly, improve a PSRR (e.g., for a signal-to-noise ratio the output differential voltage) of the amplifier. Use of the local feedback loop (e.g., for large signal processing above a threshold magnitude) can prevent harmonic distortion in the output differential due to modulation of the output common mode voltage based on the output differential voltage (as described above), where such distortion can occur, e.g., at a second harmonic of the output differential voltage.

FIG. 1 is a block diagram of an example circuit 100, which can implement a differential amplifier circuit with adaptive control. As shown in FIG. 1, the circuit 100 includes an input circuit 101, an amplifier circuit 102 (that can also be referred to herein as amplifier 102), a local feedback loop circuit 104 (that can also be referred to as a common mood loop, a local feedback loop, a loop circuit, etc.), and an adaptive control circuit 103 that can be configured to adaptively enable and disable the local feedback loop 104. In some implementations, the amplifier 102 can be an audio amplifier. In some implementations, the amplifier 102 can be a Class D amplifier. The example circuit 100 can also be referred to as a system. Depending on the particular implementation, the input circuit 101 can take a number of forms. For instance, the input circuit 101 can include a digital-to-analog converter (DAC), a differential signal coupler or buffer, a differential pre-gain amplifier, and/or other signal processing circuitry.

In some implementations, e.g., those utilizing a differential amplifier, in order to increase (e.g., maximize, etc.) an amplitude of an output voltage 16 of the amplifier 102, the output voltage 16 can include an output differential voltage and an output common mode voltage. Depending on the particular implementation, the output common mode voltage can be centered at a value that is one-half of a power supply voltage, VDD 112, or can be centered at one-half of an absolute value of the output differential voltage, such that it is independent (e.g., at least first order independent) of VDD 112.

An input common mode voltage, which can be included in an input voltage 18 of the amplifier 102, can likewise be dependent on, or be independent of the power supply voltage, VDD 112. As shown in further detail in the implementation of FIG. 2, the differential output voltage component of the output voltage 16 of the amplifier 102 can be controlled by two feedback paths, a first feedback path on a positive voltage input path (Vid(+) 218a in FIG. 2) to the amplifier 102 and a second feedback path on a negative input voltage path (Vid(−) 218b in FIG. 2) of the amplifier 102.

If either the output common mode voltage (included in the output voltage 16) or the input common mode voltage (included in the input voltage 18) is dependent on the power supply voltage (VDD 112), a common mode voltage to differential mode voltage conversion of the circuit can be dependent on the power supply voltage (VDD 112). Therefore, a mismatch or difference in the feedback provided by the two feedback paths can result in a decrease in a power supply rejection ratio (PSRR) for the amplifier 102, negatively impacting the performance of the amplifier 102 because the ability of the amplifier 102 to minimize the impact of power supply variation on the output differential voltage is reduced.

The local feedback loop circuit 104 (which can include a common mode voltage reference voltage terminal 35), as is further discussed below, can, in some implementations, reduce (or in some cases eliminate) dependency of an output common mode voltage on VDD 112 and/or can reduce harmonic distortion (harmonic noise, etc.) in the differential output voltage. In some implementations, where the output common mode voltage is based on an absolute value of an output differential voltage, such as in the implementations described herein, dependence of the output common mode voltage on VDD 112 can be reduced or prevented. In such implementations, overall performance of the amplifier 102 can be further improved by implementing adaptive control (by control circuit 103) of the local feedback loop 104, such as using the approaches described herein.

Figure 2:
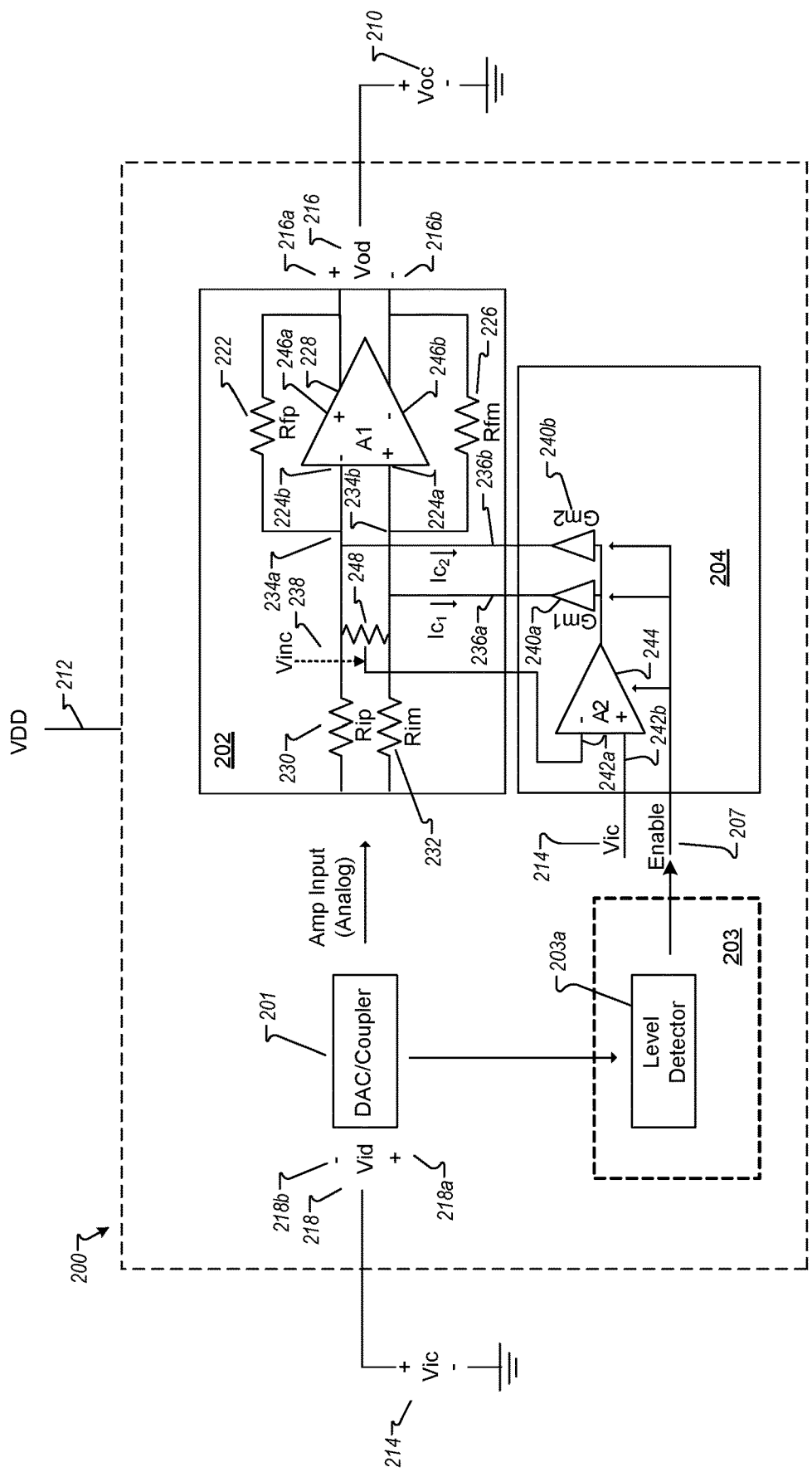
FIG. 2 is a schematic/block diagram of an implementation of the amplifier circuit of FIG. 1.

FIG. 2 is a schematic/block diagram of a circuit 200 that can be an implementation of the amplifier circuit 100 of FIG. 1. The circuit 200 of FIG. 2 illustrates circuitry (in an amplifier circuit 202) that can be included in the amplifier circuit 102 of FIG. 1, as well as circuitry (in the local feedback loop 204) that can be included in the local feedback circuit 104. Further, similar to the circuit 100, the circuit 200 includes an input circuit 201, an amplifier circuit 202, an adaptive control circuit 203 and a local (common mode) feedback loop circuit 204.

As shown in FIG. 2, depending the particular implementation, the input circuit 201 can include a DAC, a signal coupler, etc. As further shown in FIG. 2, the adaptive control circuit 203 can include a level detector 203a that can be configured to determine when a magnitude of an input signal (e.g., an analog signal, a digital signal, etc.) provided to the input circuit 201 is above or below a threshold and, in response, respectively enable and disable the local feedback loop 204 (e.g., where, in some implementations, enabling and/or disabling the local feedback loop circuit 204 can be further based on a delay timer circuit included in the adaptive control circuit 203). An example of a control circuit 303 that can be used to implement the control circuit 203 is illustrated in FIG. 3, and described below.

In the circuit 200, a feedback resistor Rfp 222 provides feedback from a positive voltage output (Vod(+) 216a) to a negative input 224b of an amplifier A1 228. In some implementations, the amplifier 228 can be a Class D amplifier. Also in the circuit 200, a feedback resistor Rfm 226 provides feedback from a negative voltage output (Vid(−) 216b) to a positive input 224a of the amplifier A1 228. The feedback resistor Rfp 222 and the feedback resistor Rfm 226 are connected to (coupled to) an input resistor Rip 230 and an input resistor Rim 232, at node 234a and node 234b, respectively. The input resistor Rim 232 and the input resistor Rip 230 are also connected to the positive input 224a and the negative input 224b, respectively, of the amplifier A1 228. An output 236a and an output 236b from the local feedback circuit 204 are connected to the positive input 224a and the negative input 224b, respectively, of the amplifier A1 228. The amplifier 228 can provide a positive output signal 246a and a negative output signal 246b. In this example, an output common mode voltage Voc 210 of the amplifier circuit 202 can be modulated to be one-half of an absolute value of the differential output voltage Vod 216.

In some implementations, a value of the input resistor Rim 232 can be equal to a value of the input resistor Rip 230. A mismatch or difference between the value of the input resistor Rim 232 and the value of the input resistor Rip 230 can be based on variations in the fabrication of each resistor. In some implementations, a value of the feedback resistor Rfp 222 can be equal to a value of the feedback resistor Rfm 226. A mismatch or difference between the value of the feedback resistor Rfp 222 and the feedback resistor Rfm 226 can be based on variations in the fabrication of each resistor.

The local feedback loop circuit 204 can drive a common mode shift across each of the input resistors, the input resistor Rip 230 and the input resistor Rim 232, to a fixed value. For example, an amplifier A2 244 can be included in the local feedback loop circuit 204 for the amplifier 228. In this example, the local feedback loop circuit 204 includes the amplifier A2 244, a transconductance driver Gm1 240a (e.g., with pull-down and/or pull-up capability), and a transconductance driver Gm2 240b (e.g., with pull-down and/or pull-up capability). As shown in FIG. 2, the amplifier 244, the driver 240a, and the driver 240b can each be configured to receive, and be enabled and disabled by an enable signal 207 provided from the adaptive control circuit 203. When disabled, the output terminals of the amplifier 244, the driver 240a and/or the driver 240b can be high impedance. As described herein, the adaptive control circuit 203 (via the level detector 203a) can be configured to provide the enable signal 207 (e.g., at logic 0 to disable the circuit 204 or logic 1 to enable the circuit 204) based on a magnitude of an input signal provided to input circuit 201, such as using the approaches described herein (as well as using a timing delay, such as described with respect to FIG. 3).

In the circuit 200, the amplifier 244 can force (drive, adjust, shift, correct, etc.) a common mode voltage using currents $I_{C1}$ and $I_{C2}$ (e.g., via the transconductance drivers 240a and 240b) at the input terminals of the amplifier 228 (as a voltage Vinc 238) to be equal to a constant voltage (e.g., a desired input common mode voltage Vic 214). As shown in FIG. 2, the input common mode voltage Vic 214 can be applied to a positive input 242b of the amplifier 244. The voltage Vinc 238 can be applied to a negative input 242a of the amplifier 244. The voltage Vinc 238 can be measured across a resistor Rinc 248. In some implementations, the input terminals of the amplifier 244 to which Vic 214 and Vinc 238 are applied can be reversed.

In some implementations, driving a common mode shift across each of the input resistors to a fixed value can reduce or eliminate the PSRR dependence on the mismatch (or difference between) the input resistors, the input resistor Rip 230 and the input resistor Rim 232, increasing the PSRR for the amplifier 202, which can positively impact performance of the amplifier 202 because the ability of the amplifier 202 to minimize the impact of power supply variation on the output differential mode voltage (Vod 216) is increased or improved.

In some implementations, providing a local feedback loop (e.g., loop 204) for the amplifier 202 that can drive a common mode shift across each of the input resistors, the input resistor Rip 230 and the input resistor Rim 232, to a fixed value can decrease input resistor area requirements. For example, input resistor area requirements can impact the overall size of the circuit 200. In order to be used in particular products, the circuit 200 may need to be of a particular size. In some implementations, a physical size of each of the input resistor Rip 230 and the input resistor Rim 232 can be increased to reduce the mismatch between the input resistor Rip 230 and the input resistor Rim 232 because the larger a size of each of the resistors, the less mismatch there will be between the resistors.

In some implementations, providing a local feedback loop 204 in the circuit 200 that can drive a common mode shift across each of the input resistors, the input resistor Rip 230 and the input resistor Rim 232, to a fixed value can allow circuitry for performing front end signal filtering and/or circuitry for performing digital signal processing and/or other types of front end modular circuitry to operate with an increased amount of headroom (e.g., operating margin). For example, amplifier headroom can be a measure of how close the input voltage to an amplifier and the output voltage from the amplifier can swing to the supply rails of the input voltage without being distorted.

As described herein, in some implementations of the circuit 200, Voc 210 can be modulated to be an absolute value of Vod 216 divided by two, e.g., |Vod/2|, which can prevent dependence of Voc 210 on a power supply voltage VDD 212 of the circuit 200, e.g., when the local (common mode) feedback loop 204 is disabled during small-signal processing, such as for input signals that are, on average, below a threshold value of the level detector 203a of the adaptive control circuit 203. As discussed herein, disabling the local feedback loop 204 during small-signal processing can result in a lower noise floor for signals applied to the inputs of the amplifier 228. As also described herein, the local feedback loop circuit 204 can be enabled (e.g., by the adaptive control circuit 203) for large-signal processing (for input signals greater than threshold), which can reduce an amount of harmonic distortion that is present in (added to) the differential output voltage Vod 216. It is noted that when performing large-signal processing, the increase in noise floor from the local feedback loop 204 being enabled is negligible compared to the magnitude of harmonics of the signals (large-signals) being processed (e.g., a differential input signal and a produced differential output signal). When operating under the foregoing specified conditions, the circuit 200 can operate in accordance with the following equations (e.g., Equations 1-6), which can be used to determine SNRs during both small-signal processing (e.g., as affected by the noise floor), and during large-signal process (e.g., as affected by harmonic distortion). The operating principles (e.g., SNR calculations) for the circuit 200 demonstrated by Equations 1-6 are further illustrated by the simulation results shown in FIGS. 4A, 4B and 5.

Equations 1 to 3 correspond with operation of the circuit 200 during small-signal processing. That is, Equations 1 to 3 presume that the local loop circuit 204 is disabled (e.g., $I_{c1}=I_{c2}=0$) and that Voc is |Vod/2|. Under such conditions, Vod 216 can be given by Equation 1:

$$Vod = \frac{1}{A_v + 1}(Vic - Voc)\left(\frac{Rfp}{Rip} - \frac{Rfm}{Rim}\right)$$

where Vod=the output differential mode voltage (Vod 216), Av=gain of the amplifier A1 228, Vic=the input common mode voltage (Vic 214), Voc=the output common mode voltage (Voc 210), Rfp=a value of the feedback resistor Rfp 222, Rfm=a value of the feedback resistor Rfm 226, Rip=a value of the input resistor Rip 230, and Rim=a value of the input resistor Rim 232.

Further, Vic 214 can be given by Equation 2:

$$Vic = \text{fixed}, \; Voc = \left|\frac{Vod}{2}\right|, \; A_v = \frac{Rfp + Rfm}{Rip + Rim}$$

where the same variable definitions as discussed for Equation 1 apply. In Equation 2, Vic is fixed, (e.g., is not dependent on VDD). Accordingly, in this example, Voc is dependent on absolute value of Vod/2. Equation 2 includes separate equations for Vic, Voc, and Av, separated by commas and independent of each other.

Given Equations 1 and 2 above, a SNR of the absolute value of Vod 216 for the circuit 200 during small-signal processing can be given by Equation 3:

$$SNR = \frac{1}{2(Av+1)}\left(\frac{Rfp}{Rip} - \frac{Rfm}{Rim}\right)$$

which illustrates that the SNR of the differential output voltage Vod 216 of the circuit 200 with the local feedback loop circuit 204 disabled is dependent on mismatch of the feedback resistors Rfp 222 and Rfm 226, as well as mismatch between the input resistors Rip 230 and Rim 232. However, the effects of these resistor mismatches, for the implementations described herein, may not be significant for small signal processing (e.g., may not result in significant harmonic distortion relative to the noise floor.

Equations 4 to 6 correspond with operation of the circuit 200 during large-signal processing. That is, Equations 4 to 6 presume that the local loop circuit 204 is enabled and that Voc is |Vod/2|. Further, the same variable definitions from Equations 1 to 3 also apply to Equations 4 to 6. Still further, Equations 4 to 6 also presume that $I_{c1}$, $I_{c2}=I_c$, or that $I_{c1}$ and $I_{c2}$ are equal to one another. Considerations resulting from implementations or situations where $I_{c1}$ and $I_{c2}$ are not equal are discussed further below. Under the above described conditions, Vod 216 can be given by Equation 4:

$$Vod = I_C(R_{fm} - R_{fp})$$

and Ic can be given by Equation 5:

$$I_c = \frac{Voc - Vinc}{Rf}, \; Voc = \left|\frac{Vod}{2}\right|.$$

Given Equations 4 and 5 above, a SNR of the absolute value of Vod 216 for the circuit 200 during large-signal processing can be given by Equation 6:

$$SNR = \frac{Rfm - Rfp}{Rfm + Rfp}$$

which illustrates that the SNR of the differential output voltage Vod 216 of the circuit 200, with the local feedback loop circuit 204 enabled, is dependent on mismatch of the feedback resistors Rfp 222 and Rfm 226, but not on mismatch between the input resistors Rip 230 and Rim 232, due to the local feedback loop 204 performing an input common mode voltage shift. That is, with the local (common mode) feedback loop 204 enabled, a SNR of Vod 216 is independent of mismatch between the input resistors Rip 230 and Rim 232. Therefore, in such implementations, a smaller area for the input resistors Rip 230 and Rim 232 can be used as compared with amplifier circuits with an adaptively controlled local feedback loop, as the circuit 200 (due to the local (common mode) feedback loop 204) has a higher tolerance to resistor mismatch that can result in harmonic distortion when the local feedback loop 204 is not present or not enabled.

As previously discussed, Equations 4-6 above assume that the current $I_{C1}$ and the current $I_{C2}$ are equal. However, in some implementations, the current $I_{C1}$ may not be equal to the current $I_{C2}$. For instance, because of a mismatch (or difference) between the transconductance driver Gm1 240a and the transconductance driver Gm2 240b, and/or a mismatch in the amplifier 244, the current $I_{C1}$ may not be equal to the current $I_{C2}$. Resistor mismatch (or difference) between the input resistor Rip 230 and the input resistor Rim 232 results in the value of the input resistor Rim 232 not being equal to the value of the input resistor Rip 230. Resistor mismatch (or difference) between the feedback resistor Rfm 226 and the feedback resistor Rfp 222 results in the value of the feedback resistor Rfm 226 not being equal to the value of the feedback resistor Rfp 222.

In some implementations, in order to have the current $I_{C1}$ equal to the current $I_{C2}$ so that Equation 6 for the SNR for the circuit 200 depends on the mismatch (or difference) between the feedback resistor Rfp 222 and the feedback resistor Rfm 226, and does not depend on mismatch between the input resistors Rip 230 and Rim 232, chopper switches can be included in the local feedback loop circuit 204, such as further discussed below with respect to FIG. 6.

Briefly, however, use of the chopper switches in the local (common mode) loop circuit 204 can further reduce (and in some cases eliminate) dependency of SNR (and PSRR) on the mismatch between the input resistor Rim 232 and the input resistor Rip 230. Such chopper switches can operate based on a chopper clock signal provided by an associated chopper clock circuit, where the chopper clock signal is used to control switching of the chopper switches. Such a chopper clock signal can have a fixed frequency, a fixed duty cycle, a variable frequency and/or a variable duty cycle. In some implementations, the chopper switches can switch a higher value current between the positive input 224a and the negative input 224b of the amplifier A1 228. This switching can keep the current into each of the positive input 224a and the negative input 224b of the amplifier A1 228 essentially equal. In such implementations, use of chopper switches can result in equalizing the current into the positive input 224a and the negative input 224b of the amplifier A1 228 while not adversely affecting the performance of the circuit 200. For example, folded out-of-band noise for the amplifier 202 may not be adversely affected (e.g., the folded out-of-band noise will not increase). Further, the total harmonic distortion (THD) for the amplifier 202 may not be adversely affected (e.g., the THD for the amplifier 202 will not increase).

Figure 3A:
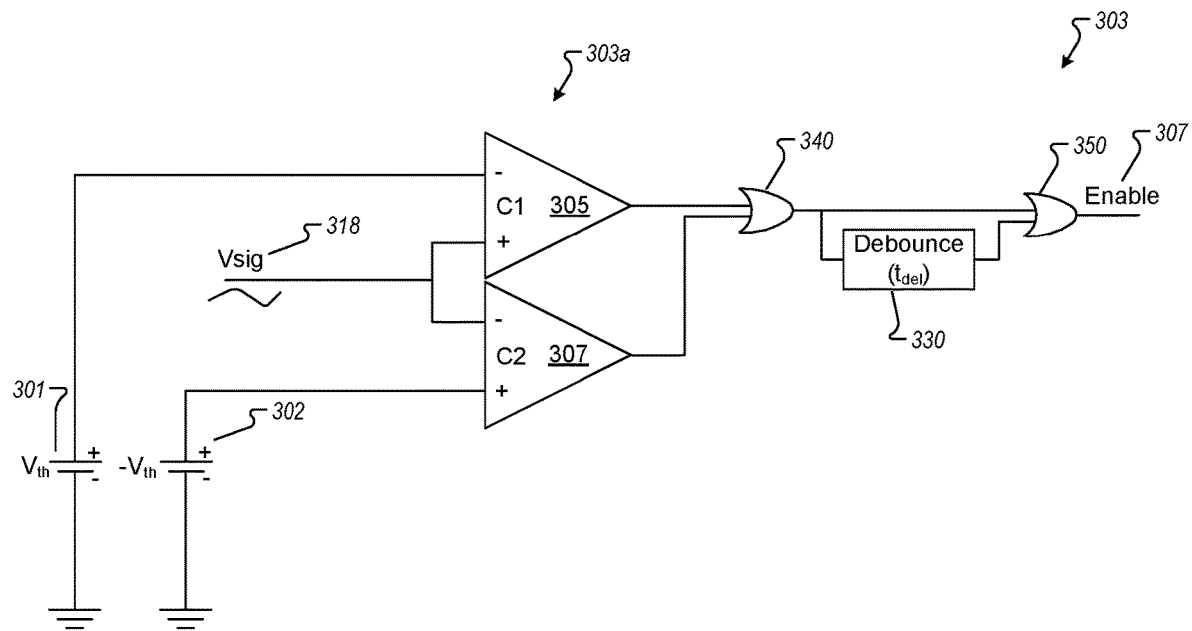
FIG. 3A is a schematic diagram of a control circuit that can be implemented in the amplifier circuits of FIGS. 1 and 2.
Figure 3B:
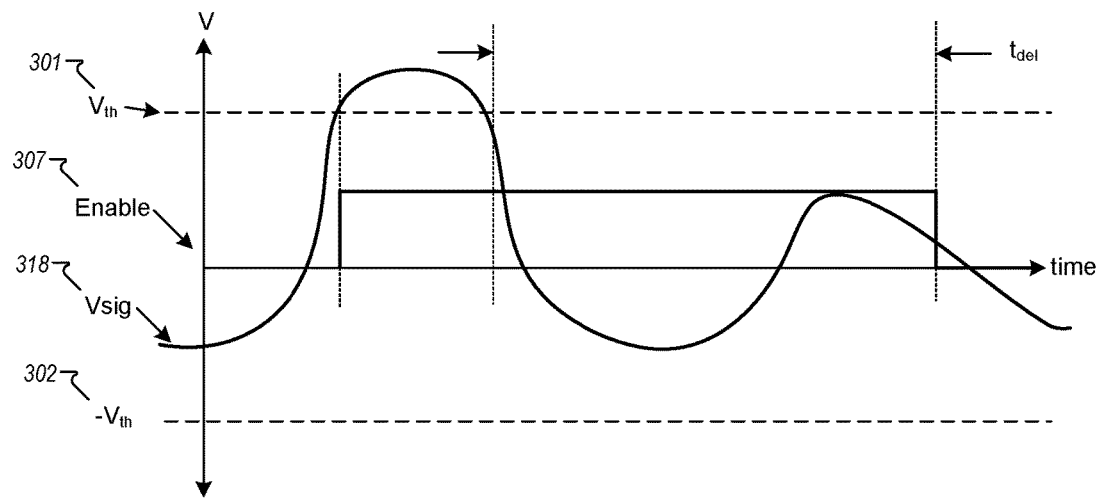
FIG. 3B is a timing diagram schematically illustrating operation of the control circuit of FIG. 3A.

FIG. 3A is a schematic/block diagram of a control circuit 303 that can be implemented in the amplifier circuits of FIGS. 1 and 2, such as the adaptive control circuit 103 or the adaptive control circuit 203. FIG. 3B is a timing diagram schematically illustrating operation of the control circuit 303 of FIG. 3A. The circuit 303 can be used, e.g., in an amplifier circuit, to adaptively control (e.g., enable and disable) a local (common mode) feedback loop based, for instance, on a magnitude of an input signal provided to the amplifier circuit. That is, in the implementations described herein, the control circuit 303 can disable a local feedback loop circuit for small-signal processing (e.g., for processing input differential signals having a peak magnitude that is below a threshold) and enable the local feedback loop circuit for large-signal processing (input differential signals having a peak magnitude that is above the threshold).

As shown in FIG. 3, the control circuit 303 can include an upper threshold reference voltage Vth 301, and a lower threshold reference voltage −Vth 302. In some implementations, Vth 301 can be used to determine if a positive magnitude of an input differential signal Vsig 318 is above a threshold (e.g., a small-signal to large-signal threshold), while −Vth 302 can be used to determine if a positive magnitude of the input differential signal Vsig 318 is above the threshold (e.g., an absolute value of the small-signal to large-signal threshold).

As shown in FIG. 3, the control circuit 303 includes a level detector 303a, which can be configured to detect when a magnitude of Vsig 318 crosses one of the threshold values, Vth 301 or −Vth 302. The level detector 303a, in this example, includes a first comparator C1 305 and a second comparator C2 307. In this implementation, the comparator C1 305 compares Vsig 318 to Vth 301 and asserts a logic 1 when Vsig 318 exceeds Vth 301. Likewise, in this implementation, the comparator C2 307 compares Vsig 318 to −Vth 302 and asserts a logic 1 when Vsig 318 goes below −Vth 302. In other implementations, the level detector 303a can be implemented in other ways, such as using digital circuitry that is configured to determine a signal magnitude that is represented as a digital value.

In the example control circuit 303 of FIG. 3, the OR gate 340 combines the outputs of the comparators 305 and 307 to indicate whether Vsig has exceeded Vth 301 or gone below −Vth 302. In this example, if either threshold is crossed (an absolute value of the threshold is exceeded by an absolute value of the peak of Vsig 318), the output of the OR gate 340 will be asserted to logic 1 and an enable signal 307 will, as a result, also be asserted to logic 1. In the implementations described herein, the enable signal 307 can be used to adaptively enable a local (common mode) feedback loop, such as the respective local feedback loops 104 and 204 shown in FIGS. 1 and 2.

The circuit 303 of FIG. 3 also includes a delay timer 330 that can, in conjunction with an OR gate 350, implement a disable time delay $t_{del}$ for an associated local feedback loop. Depending on the particular implementation, the delay timer 330 can be a resistive-capacitive (RC), or can be a digital timer (e.g., a digital counter that counts clock edges of a clock signal for an associated amplifier circuit). In some implementations, the timer 330 can take other forms. In this example, the timer 330 can be configured to assert a logic 1 in response to the output of the OR gate 340 transitioning from logic 0 (threshold not exceeded by Vsig 318) to logic 1 (threshold exceeded by Vsig 318).

Operation of the timer 330 to determine passage of the time $t_{del}$, in this implementation, can be triggered by the output signal of the OR gate 340 transitioning from logic 1 to logic 0, which indicates that a magnitude of Vsig 318 is between Vth 301 and −Vth 302 (e.g., due to a periodicity of Vsig 318, such as for a sine wave signal). In this example, the timer 330 may continue to assert a logic 1 for the time period $t_{del}$, which will cause the output of the OR gate 350 to remain high and an associated local (common mode) feedback loop to remain enabled for, at least, $t_{del}$ after the output of the OR gate 340 switches to logic zero. If Vsig 318 crosses either of the thresholds Vth 301 or −Vth 302 again during the time period $t_{del}$, the timer 330 can be configured to reset, and the above process can repeat in response to the magnitude of Vsig 318 again moving between the thresholds Vth 301 and −Vth 302 (e.g., rather than an absolute value of Vsig 318 exceeding a respective absolute value of either of the thresholds).

However, if Vsig 318 does not cross either of the thresholds Vth 301 or −Vth 302 again during the time period $t_{del}$, the timer 330, in this example, will expire and the output of the timer will move to logic 0 (with the output of the OR gate 340 also being logic 0). Accordingly, the output of the OR gate 350 would then be logic 0 and the associated local feedback loop would be disabled for small-signal processing. The graph in FIG. 3B illustrates the behavior of the circuit 300, as described above. It is noted that, in FIG. 3B, if the magnitude of Vsig 318 were to fall below −Vth 302 in the illustrated timing diagram, the enable signal 307 would be asserted to logic 1, and the timer circuit 330 would operate as discussed above.

Figure 4A:
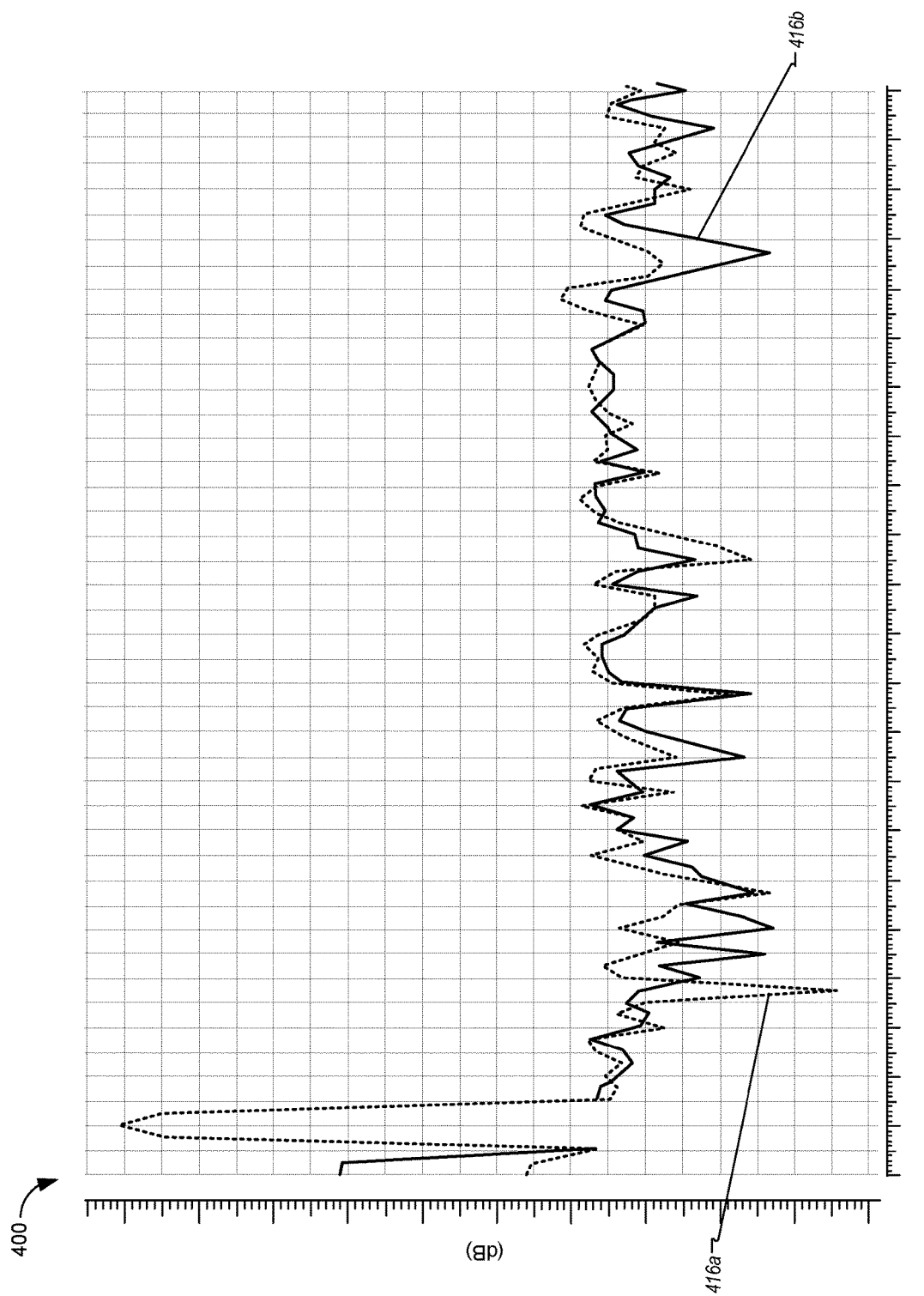
FIG. 4A is graph illustrating a comparison of small signal operation of an implementation of the amplifier circuit of FIG. 2, with a common mode (local feedback) loop enabled and disabled.
Figure 4B:
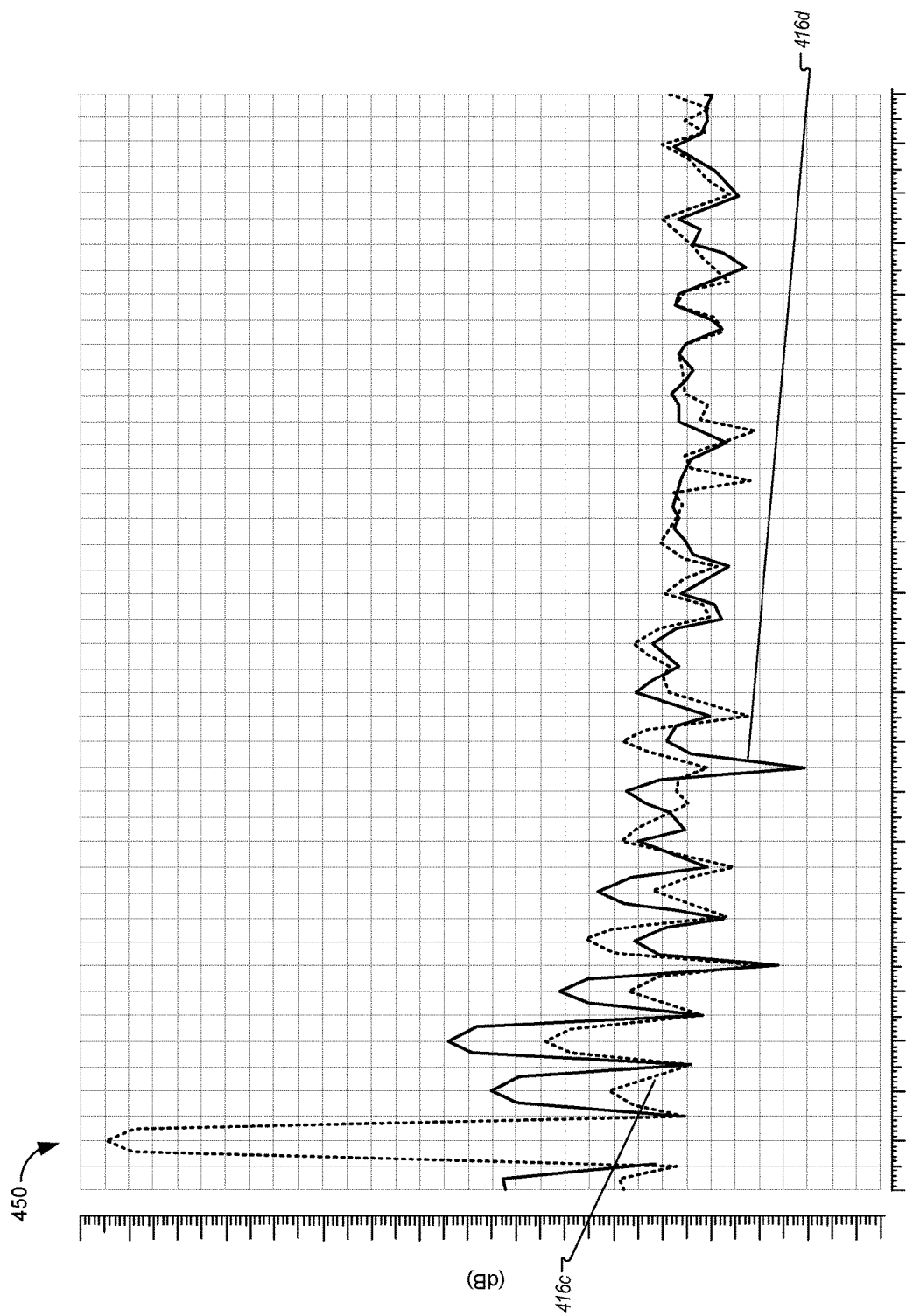
FIG. 4B is graph illustrating a comparison of large signal operation of an implementation of the amplifier circuit of FIG. 2, with a common mode (local feedback) loop enabled and disabled.

FIG. 4A is graph 400 illustrating a comparison of small-signal operation of (small-signal processing by) an implementation of the amplifier circuit of FIG. 2, with a common mode (local feedback) loop enabled (trace 416a) and disabled (trace 416b). FIG. 4B is graph 450 illustrating a comparison of large-signal operation of (large-signal processing by) an implementation of the amplifier circuit of FIG. 2, with a common mode (local feedback) loop enabled (trace 416c) and disabled (trace 416d). The graphs 400 and 450 are normalized plots of simulated differential output signal magnitude (e.g., in dB shown on the y-axis) across signal frequencies (e.g., kHz on the x-axis, in log-scale for an amplifier circuit with a gain of 20 dB based on a same input differential signal.

As can be seen from a comparison of the trace 416a (local feedback loop enabled) with the trace 416b (local feedback loop disabled) in FIG. 4A, for small signal processing, the noise floor, e.g., the amount of noise present in the output signal of the trace 416a, with the local feedback loop enabled is increased, as compared to the noise floor, e.g., the amount of noise present in the output signal of the trace 416b, with the local feedback loop disabled. Further, as can be seen from a comparison of the trace 416c (local feedback loop enabled) with the trace 416d (local feedback loop disabled) in FIG. 4B (for large-signal processing), harmonic distortion (e.g., at the positive and negative signal peaks) in the output signal of the trace 416c with the local feedback loop enabled is decreased as compared to the harmonic distortion in the output signal of the trace 416d with the local feedback loop disabled. Accordingly, amplifiers implementing the adaptive local feedback loop control approaches described herein can have improved noise levels (e.g., when processing small signals) and reduced harmonic distortion (e.g., when processing large-signals) and, thus, improved overall performance as compared to prior amplifier implementations.

Figure 5:
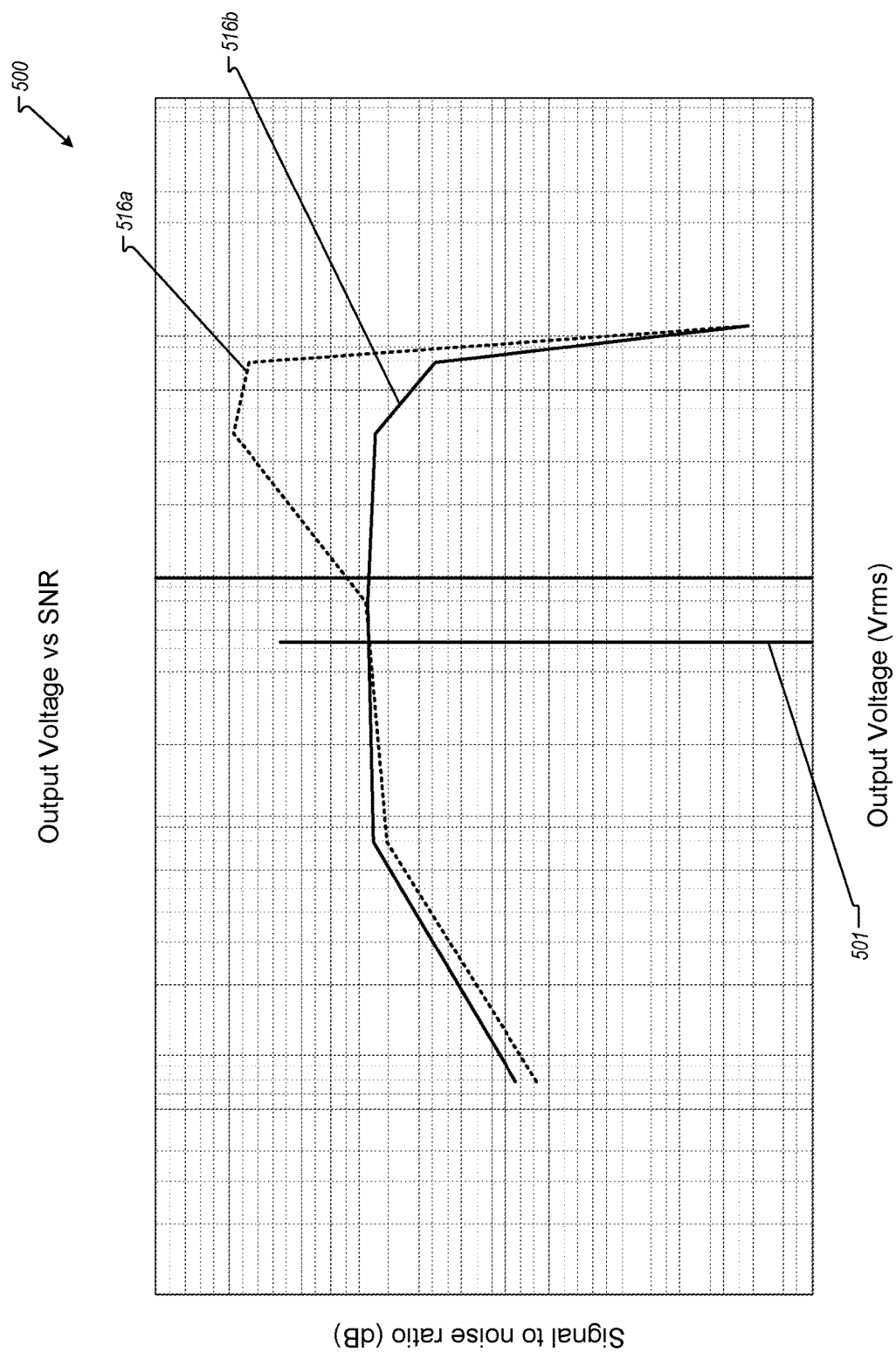
FIG. 5 is a graph illustrating a comparison of operation of an implementation of the amplifier circuit of FIG. 2 over a range of output voltages, with a common loop enabled and disabled.

FIG. 5 is a 500 graph illustrating a comparison of operation of an implementation of the amplifier circuit of FIG. 2 over a range of output voltages, with a common loop enabled and operation with a common mode loop disabled. That is, the graph 500 illustrates a normalized, simulated SNR (on the y-axis) for an amplifier implementation with a local feedback (common mode) loop enabled (trace 516a) and disabled (516b). The traces 516a and 516b are illustrated over a range of amplifier output voltage magnitudes, e.g., shown on a normalized log scale on the x-axis. The line 501 in FIG. 5, which is illustrative and given by way of example, corresponds with a threshold voltage for enabling a local feedback (common mode) loop, such as the local feedback loop circuit 204 in an implementation of the amplifier circuit 200 in FIG. 2. The line 501 can be referred to as indicating a crossover point of the traces 516a and 516b (e.g., between a noise dominated region and a harmonic distortion dominated region).

As shown in FIG. 5, below the threshold voltage represented by the line 501 (e.g., to the left of the line 501, in a Noise Dominated region, in a small-signal processing region, etc.) the trace 516b illustrates, when compared with the trace 516a, that a noise floor (an amount of output signal noise) of the example amplifier is reduced when the local feedback (common mode) loop is disabled. As also shown in FIG. 5, above the threshold voltage represented by the line 501 (e.g., to the right of the line 501 and below a Clipping voltage, in a Harmonic (noise/distortion) Dominated region, in a large-signal processing region, etc.) the trace 516b illustrates, when compared with the trace 516a, that harmonic noise of the example amplifier is reduced (e.g., the SNR is higher) with the local feedback (common mode) loop enabled. Once a high enough output voltage (e.g., based on an input voltage and a gain of the amplifier) is reached, the output voltage will be clipped, and the SNR ratio will drop, regardless of whether the local feedback (common mode) loop is enabled (trace 516a) or disabled (trace 516b). Such a clipping voltage will depend on the particular amplifier implementation.

Figure 6:
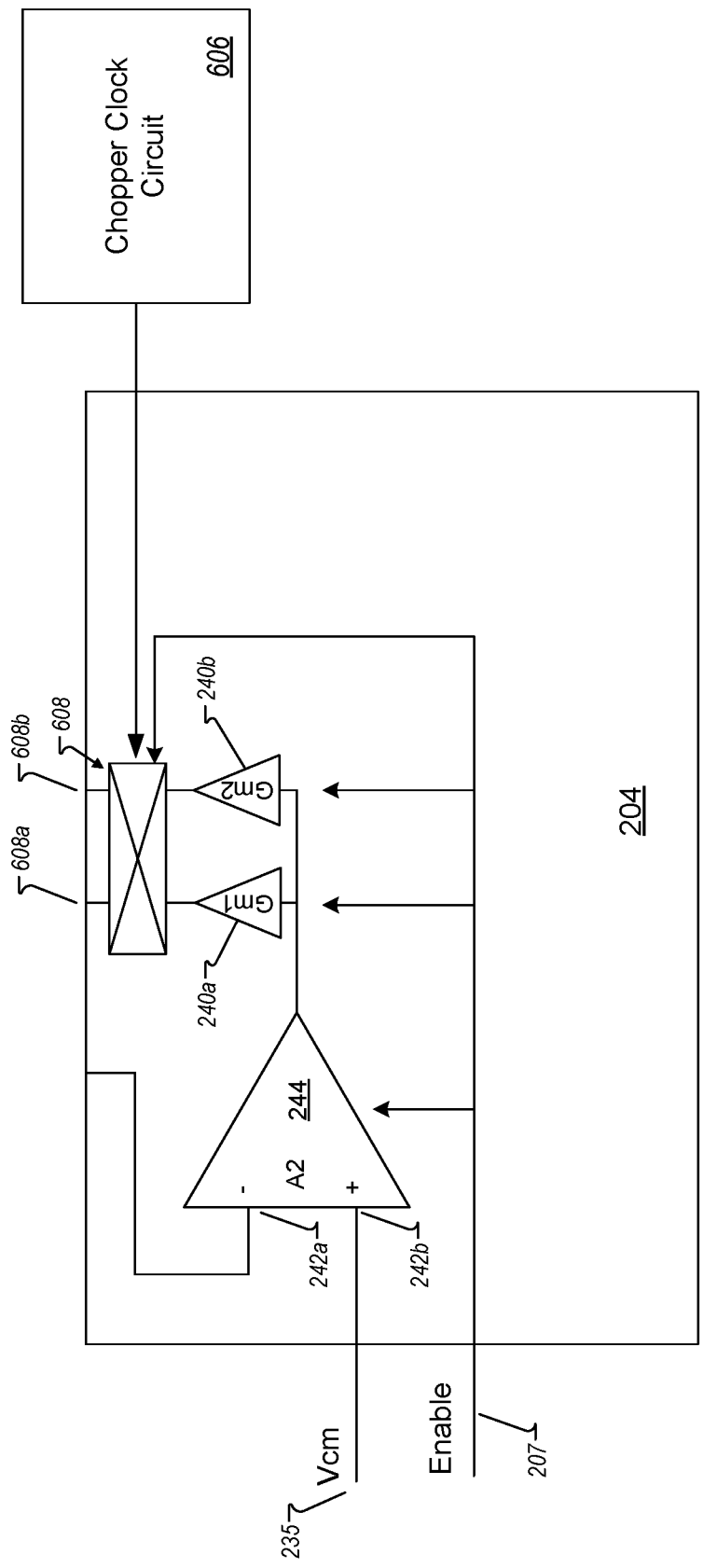
FIG. 6 is a block diagram illustrating a local feedback circuit that includes chopper switches and a chopper clock.

FIG. 6 is a schematic/block diagram of an implementation of the local feedback circuit 204 of FIG. 2 that further includes a chopper clock circuit 606 and chopper switches 608, which can also be referred to as chopper circuit 608. In the implementation of FIG. 6, the local feedback circuit 204 also includes the elements of the implementation of the local feedback circuit 204 shown in FIG. 2, including a common mode voltage input 235; an enable signal input 207 from an adaptive control circuit (e.g., circuit 303); amplifier 244 with the positive (common mode voltage) input 242b and the negative (input common mode feedback) input 242a; and transconductance drivers 240a and 240b. For purposes of brevity, these elements are not described in detail again with respect to FIG. 6.

As shown in FIG. 6, the chopper circuit 608 can provide output signals 608a and 608b that be used to reduce (or in some cases eliminate) effects due the mismatch between the transconductance drivers 240a and 240b (e.g., during large signal processing), such as by equalizing currents on the positive and negative inputs of a differential amplifier (e.g., the amplifier 228 of FIG. 2), such as using the approaches described herein.

In some implementations, the chopper clock circuit 606 can provide a variable frequency, variable duty cycle clock signal to the chopper switches (chopper circuit) 608. The use of a variable frequency, variable duty cycle clock signal to clock the chopper switches 608 can also reduce flicker noise contributions by elements of the common mode loop circuit 204 (e.g. the amplifier 244, and/or the transconductance drivers 240a and 240b). In such implementations (with reference to FIG. 2 by way of example), reductions in flicker noise and the dependency on the mismatch of the feedback resistors Rfp 222 and Rfm 224 included in the feedback paths of the amplifier circuit 202 can occur without adversely affecting folded out-of-band noise (e.g., folded out-of-band noise will not increase), or without adversely affecting a total harmonic distortion (THD) for the amplifier circuit 202.

For example, in the case of the amplifier 202 being an audio amplifier (e.g., a Class D amplifier), out-of-band noise can be noise that is included in frequencies outside of an audio band (e.g., 20 hertz (Hz.) to 20 kilohertz (kHz.)). In some implementations, the amplifier circuit 202 can alias an input signal resulting in the out-of-band noise being folded back into the audio band. The reduction in the flicker noise and the dependency on the mismatch of the feedback resistors included in the feedback paths (e.g., in common mode voltage to differential mode voltage conversion) of the amplifier circuit 202 can occur without increasing an amount (if present) of folded out-of-band noise for the amplifier circuit 202.

Figure 7:
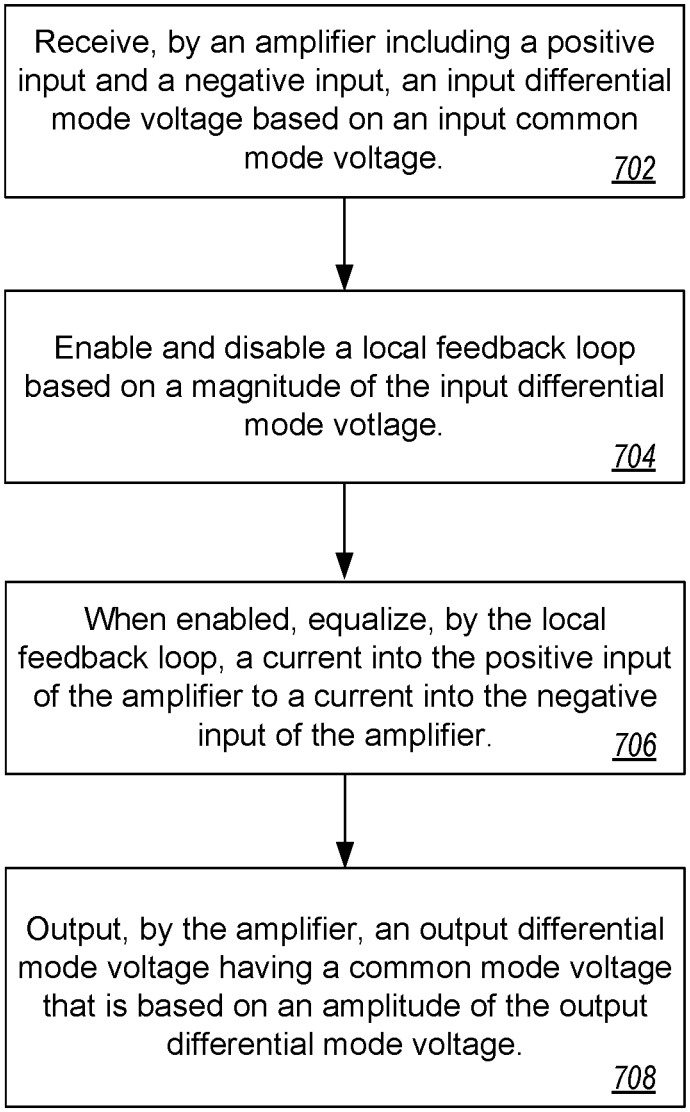
FIG. 7 is a flowchart that illustrates a method for operation of an amplifier circuit.

FIG. 7 is a flowchart that illustrates an example method 700 for operation of an amplifier (e.g., a differential amplifier) including an adaptively controlled local loop circuit. In some implementations, the circuits, devices, systems, and processes described herein can implement the method 700. For example, the method 700 can be described with reference to FIGS. 1, 2, 3 and/or 6.

In the method 700, an amplifier including a positive input and a negative input can receive an input differential voltage that is based on (includes, etc.) an input common mode voltage (block 702). For example, the amplifier 228 of FIG. 2 can receive the input differential mode voltage Vid 218 that is based on the input common mode voltage Vic 214.

A local feedback loop can be adaptively controlled (e.g., enabled and disabled) based on a magnitude (e.g., an absolute value) of the input differential voltage (block 704). For instance, a control circuit, such as the control circuit 303 of FIG. 3, can be used to adaptively control (e.g., enable and disable) a local feedback loop (e.g., local feedback loop 204 of FIG. 2). For instance, as described above, the local feedback loop can be enabled when a magnitude of the differential input voltage exceeds a threshold. As also described above, the local feedback loop can be disabled then the magnitude of the differential input voltage is below the threshold voltage (e.g., below the threshold voltage of a threshold period of time).

The local feedback loop, when enabled, can control current into a positive input of the amplifier (amplifier 228) and current into the negative input of the amplifier. For instance, the local feedback loop's control of currents into the positive and negative inputs of the amplifier can reduce (or in some cases eliminate) effects of mismatch of feedback resistors included in the feedback paths (e.g., feedback resistors Rfp 222 and Rfm 226 in FIG. 2) on an corresponding input common mode voltage (e.g., Vic 214 in FIG. 2).

In some implementations, controlling the input differential voltage (e.g., controlling the input common mode voltage by the local feedback loop) can include switching, by chopper switches, a higher value current between the positive input and the negative input, such as described herein. For example, the currents controlled by the local feedback loop (e.g., local feedback loop output signals) can be chopped using chopper switches (e.g., chopper switches 608 in FIG. 6) in order to reduce (or in some cases eliminate) mismatch between the transconductance drivers 240a and 240b.

Controlling the input differential voltage at block 706 can include (e.g., based on switching of the chopper switches) equalizing a current into the positive input of the amplifier to a current into the negative input of the amplifier, and/or equalizing a current into the positive input of the amplifier to a current into the negative input of the amplifier based on the switching. For example, in some implementations, the chopper switches can switch the higher value current between a positive input and a negative input of an amplifier (such as the amplifier A1 228 in FIG. 2). This switching can keep the current into each of the positive input and the negative input of the amplifier equal (approximately equal, effectively equal, substantially equal, etc.).

In the method 700, the amplifier can output an output differential voltage that is based on (has) an output common mode voltage, where output common mode voltage is based on an amplitude (magnitude) of the output differential voltage (block 708). In some implementations, such as those described herein, the output common mode voltage can be a voltage that is an absolute value of the output differential voltage divided by two. Accordingly, the output differential mode voltage can be independent of a power supply voltage (Vdd) for the amplifier during both small and large signal processing. Further, use of the local feedback loop (e.g., enabling the local feedback loop) during large signal processing can prevent harmonic distortion in the output differential voltage.

It will be understood that, in the foregoing description, when an element is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element, there are no intervening elements present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Implementations of the various techniques described herein may be implemented in (e.g., included in) digital electronic circuitry, or in computer hardware, firmware, software, or in combinations of them. Portions of methods also may be performed by, and an apparatus may be implemented as, special purpose logic circuitry, e.g., an FPGA (field programmable gate array) or an ASIC (application specific integrated circuit).

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A circuit comprising:
an input circuit configured to receive an input signal;
an amplifier circuit coupled with the input circuit, the amplifier circuit including a first amplifier, a first feedback path, and a second feedback path, the first feedback path providing a feedback path from a positive output of the first amplifier to a negative input of the first amplifier and the second feedback path providing a feedback path from a negative output of the first amplifier to a positive input of the first amplifier;
a loop circuit including a second amplifier, the loop circuit being configured to provide a local feedback loop for the first amplifier and configured to control current flow into the positive input of the first amplifier and current flow into the negative input of the first amplifier; and
a control circuit coupled with the input circuit and the loop circuit, the control circuit being configured to enable the loop circuit in response to a magnitude of the input signal exceeding a threshold.

2. The circuit of claim 1, wherein the control circuit is further configured to disable the loop circuit in response to the magnitude of the input signal being below the threshold for a period of time.

3. The circuit of claim 2, wherein the control circuit is further configured to determine the magnitude of the input signal based on one of:
an analog input signal; or
a digital input signal.

4. The circuit of claim 2, wherein the control circuit includes a timing circuit configured to measure the period of time.

5. The circuit of claim 4, wherein the timing circuit includes one of:
a digital counter; or
a resistive-capacitive timer.

6. The circuit of claim 1, wherein the input circuit includes a digital-to-analog converter configured to receive a digital signal and provide an analog signal corresponding with the digital signal to the amplifier circuit.

7. The circuit of claim 1, wherein the input circuit includes a pre-gain amplifier configured to receive an analog signal and provide an amplified or buffered version of the analog signal to the amplifier circuit.

8. The circuit of claim 1, further comprising:
a chopper clock circuit configured to output a chopper clock signal,
the loop circuit further including chopper switches, the chopper switches being configured to receive the chopper clock signal from the chopper clock circuit and control the current flow into the positive input of the first amplifier and the current flow into the negative input of the first amplifier.

9. The circuit of claim 1, wherein the amplifier circuit is a differential amplifier circuit.

10. The circuit of claim 1, wherein the second amplifier is configured, when the loop circuit is enabled, to force a voltage at the negative input of the first amplifier and at the positive input of the first amplifier to be equal to a constant voltage that is independent of a power supply voltage of the circuit.

11. The circuit of claim 10 wherein a first input to the second amplifier is the constant voltage and a second input to the second amplifier is a voltage representative of a voltage shift across a first input resistor and a second input resistor.

12. A system comprising:
a differential amplifier circuit including a first differential amplifier, a first feedback path, and a second feedback path, the first feedback path providing a feedback path from a positive output of the first differential amplifier to a negative input of the first differential amplifier and the second feedback path providing a feedback path from a negative output of the first differential amplifier to a positive input of the first differential amplifier;
a common mode loop circuit including a second differential amplifier, the common mode loop circuit configured to provide a local feedback loop for the first differential amplifier, and configured to control current flow into the positive input of the first differential amplifier and current flow into the negative input of the first differential amplifier; and
a control circuit coupled with the common mode loop circuit, the control circuit being configured to enable the common mode loop circuit in response to a magnitude of a differential input signal of the differential amplifier exceeding a threshold.

13. The system of claim 12, wherein a output common mode voltage of the differential amplifier circuit is modulated to be an absolute value of a magnitude of a differential output voltage of differential amplifier circuit divided by two, the power supply rejection ratio for the first amplifier is dependent on a mismatch between a resistance of the first feedback path and a resistance of the second feedback path.

14. The system of claim 12, wherein the control circuit is further configured to disable the loop circuit in response to the magnitude of the input signal being below the threshold for a period of time.

15. The system of claim 14, wherein the control circuit is further configured to determine the magnitude of the input signal based on one of:
an analog input signal; or
a digital input signal.

16. The system of claim 14, wherein the control circuit includes a timing circuit configured to measure the period of time.

17. The system of claim 16, wherein the timing circuit includes one of:
a digital counter; or
a resistive-capacitive timer.

18. The system of claim 12, wherein the first differential amplifier is a Class D amplifier and the system is included in an audio amplifier.

19. The system of claim 12, wherein the second differential amplifier is configured, when the common mode loop circuit is enabled, to force a common mode voltage at the negative input of the first amplifier and at the positive input of the first amplifier to be equal to a constant voltage that is independent of a power supply voltage of the system.

20. A circuit comprising:
an input circuit configured to receive a differential input signal;
a differential amplifier circuit coupled with the input circuit, the differential amplifier circuit including a first differential amplifier, a first feedback path, and a second feedback path, the first feedback path providing a feedback path from a positive output of the first differential amplifier to a negative input of the first differential amplifier and the second feedback path providing a feedback path from a negative output of the first differential amplifier to a positive input of the first differential amplifier;

a chopper clock circuit configured to output a chopper clock;

a common mode loop circuit including a second differential amplifier and chopper switches, the common mode loop circuit configured to provide a local feedback loop for the first differential amplifier, the chopper switches configured to receive the chopper clock signal from the chopper clock circuit and configured to control a current flow into the positive input of the first amplifier and into the negative input of the first amplifier; and a control circuit coupled with the common mode loop circuit, the control circuit being configured to enable the common mode loop circuit in response to a magnitude of the differential input signal exceeding a threshold.

* * * * *